(12) United States Patent
Ku

(10) Patent No.: US 6,743,038 B2
(45) Date of Patent: Jun. 1, 2004

(54) ZERO INSERTION FORCE CONNECTOR BASING ON SURFACE CONTACT

(76) Inventor: Yueh-Chu Ku, 8F, No. 114, Sec. 2, Chungshan N. Rd., Taipei (TW)

( * ) Notice: Subject to any disclaimer, the term of this patent is extended or adjusted under 35 U.S.C. 154(b) by 0 days.

(21) Appl. No.: 10/252,663

(22) Filed: Sep. 23, 2002

(65) Prior Publication Data

US 2004/0058578 A1 Mar. 25, 2004

(51) Int. Cl.⁷ .................................................. H01R 4/50
(52) U.S. Cl. ....................... 439/342; 439/70; 439/74; 439/247; 439/248; 439/374
(58) Field of Search ............................ 439/342, 374, 439/70, 74, 78, 247, 248, 590, 660, 682, 686, 689, 736, 874, 263, 266, 260, 495, 329

(56) References Cited

U.S. PATENT DOCUMENTS

| | | | | |
|---|---|---|---|---|
| 4,314,736 A | * | 2/1982 | Demnianiuk | |
| 4,778,403 A | * | 10/1988 | Ikesugi et al. | |
| 5,123,855 A | * | 6/1992 | Petersen | |
| 6,280,217 B1 | * | 8/2001 | Lin | |
| 6,280,223 B1 | * | 8/2001 | Lin | |

\* cited by examiner

*Primary Examiner*—Anthony Dinkins
*Assistant Examiner*—Nguyen T. Ha
(74) *Attorney, Agent, or Firm*—Jackson Walker LLP

(57) ABSTRACT

A zero insertion force connector basing on surface contact having a connector base with multiple connecting terminals installed thereon in array form, a sliding cover, and a clamping lever for securing the sliding cover in position. Each connecting terminal is appropriately bent at the lower end to form a contact surface, so that when the connector is placed on a substrate, each connecting terminal is matched by a corresponding solder pad leading to the internal circuit inside the substrate. With only a small amount of applied force to join the connecting terminals onto the substrate by soldering, the connector can thus be mounted onto the substrate with reliability.

2 Claims, 5 Drawing Sheets

US 6,743,038 B2

ZERO INSERTION FORCE CONNECTOR BASING ON SURFACE CONTACT

BACKGROUND OF THE INVENTION

1. Field of the Invention

The present invention relates to a zero insertion force connector, in particular to a structural design of the connecting terminals on the connector that can prevent PGA package pins from damaging the plated through holes and poor contacts of solder balls for BGA packages, basing on surface contact to join the zero insertion force connector and the substrate.

2. Description of Related Arts

For Intel's Pentium™ series of CPU, with the exception of Pentium II™, the new generation of Pentium CPUs has used the zero insertion force connector to mount onto the substrate as shown in FIG. 4. The connector comprises a connector base (70), a sliding cover (71), and a clamping lever (72)

The connector base (70) having multiple connecting terminals (701) in PGA form (as shown in FIG. 5) is to be inserted into corresponding through holes (81) in the substrate (80) and joined with the substrate (80) after soldering the projections on the back side. The connector could also be adapted for solder ball type BGA packages.

The sliding cover (71) is to be placed over the connector base (70), allowing the cover (71) to be shifted horizontally over the surface of the connector base (70). The cover (71) has multiple insertion holes (711) on the surface in array format (as shown in FIG. 4). Each insertion hole (711) is matched by a corresponding connecting terminal (701) on the connector base (70). However, the insertion holes (711) and the connecting terminals (701) on the connector base (70) are in alternately arranged positions before shifting of the sliding cover (71). The cover (71) has to be slid horizontally from the first position to the second position, so that the insertion holes (711) are lined up with the connecting terminals (701) on the substrate (80), and the CPU with the projections are inserted onto the insertion hole (711) of the sliding cover (71). When the cover (71) is initially placed in the first position, the PGA package pins of the CPU are kept separate from the connecting terminals (701), but when the cover (71) is moved into the second position, the PGA package pins can be inserted through the insertion holes (711) and make contact with the connecting terminals (701) for electrical connection.

The clamping lever (72) is installed on the common end of the connector base (70) and the sliding cover (71) on the lateral side, clamping together the opposing faces of the sliding cover (71) and connector base (70) separated by a small distance. The clamping lever (72) is used for securing the sliding cover to prevent any horizontal shifting after mounting of the connector.

The mechanical components and the operating principles of the zero insertion force connector have been widely publicized in related literature, so this part therefore will not be further discussed. The focus of the present disclosure is on how to install the zero insertion force connector onto the substrate with good reliability and the structure associated therewith.

A typical connecting terminal (701) of zero insertion force connector for a pin grid array (PGA) package, as shown in FIG. 5, are designed with the connecting terminals (701) directly inserted into the substrate (80) through the plated through holes (81). Since the projected ends of the connecting terminals (701) are quite sharp, the pointed terminals (701) often cause physical damage to the electroplated layer on the through holes (81), thereby affecting the electrical performance of the substrate (80).

Another kind of commonly used zero insertion force connector is constructed for ball grid array (BGA) packages (as shown in FIG. 6). The connecting terminals (701) of this kind of package are connected to the substrate by means of solder balls. These solder balls acting as terminals are so tiny and densely packed in a relatively small grid that an abnormal phenomenon will develop when the surface of the substrate (80) is not smooth. That is, a small portion of the solder balls cannot form solid contact with the solder pads on the substrate.

Thus the installation of zero insertion force connectors on the substrate, for both PGA and BGA packages, still has certain flaws using the conventional techniques mentioned above. There are risks of damaging the internal circuit on the substrate for PGA packages and poor electrical contact for BGA packages. To overcome the above-mentioned situations an improved connecting apparatus and technique is needed.

SUMMARY OF THE INVENTION

The main object of the present invention is to provide a zero insertion force connector that is capable of preventing physical damage to the internal circuit connected through plated through holes as well as eliminating poor contacts for ball grid array packages.

The zero insertion force connector in accordance with the present invention comprises:

a connector base having multiple connecting terminals in array format;

a sliding cover which can shift horizontally over the connector base into predetermined position; and a clamping lever with an "L" shape construct, the horizontal portion of which is fixed on the common end of the connector base, used for clamping against the sliding cover to prevent the cover from shifting in the horizontal direction.

Each connecting terminal on the connector base is formed as in a strip having one end bent to form a contact plate matching against the circuit junctions at predetermined positions on the substrate.

When the connector is appropriately placed over the substrate and a small amount of pressure is applied, the connecting terminals come into contact with the circuit junctions on the substrate, so that the connector can join with the substrate with good reliability after soldering of the joints at the back of the substrate has been performed.

The lower portion of the connecting terminals forming the contact plate is bent at a predetermined angle to ensure good contact with the corresponding pad on the substrate.

The features and structure of the present invention will be more clearly understood when taken in conjunction with the accompanying figures.

DETAILED DESCRIPTION OF THE PREFERRED EMBODIMENT

Figure 1:
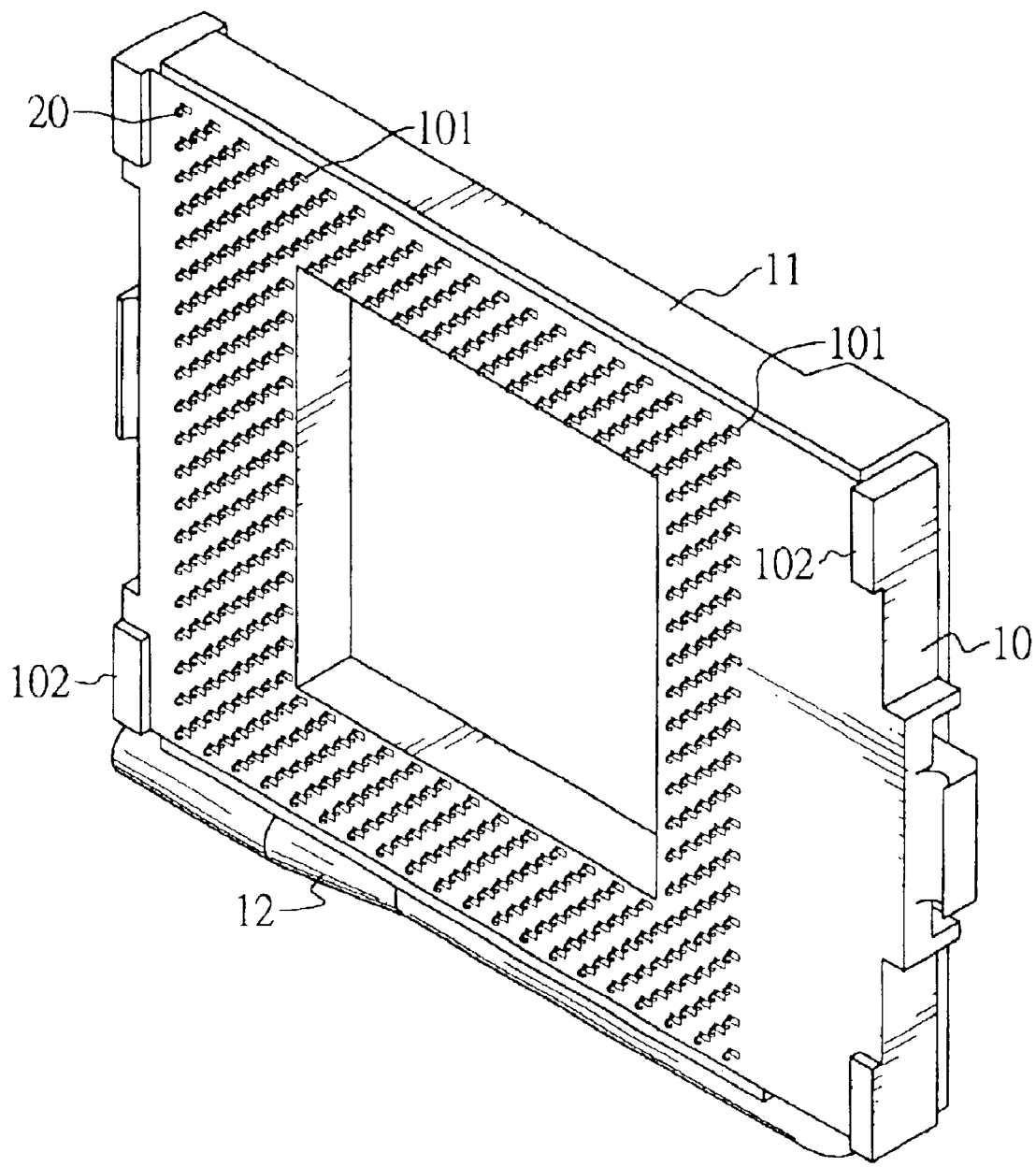
FIG. 1 is a perspective bottom view of the present invention.

In the following detailed description of the preferred embodiment, reference is made to the accompanying drawings, which shows specific embodiments in which the invention may be practiced. In the drawings, and like numerals describe substantially similar components throughout the several views. These embodiments are described in sufficient detail to enable those skilled in the art to practice the invention. Other embodiments may be used and structural, logical and electrical changes may be made without departing from the scope of the present invention.

FIG. 1 shows the structure of a zero insertion force connector in accordance with the present invention that is capable of preventing both physical damage to the internal circuit connected by plated through holes and poor contacts for the ball grid array connectors.

The zero insertion force connector in accordance with the present invention comprises a connector base (10), a sliding cover (11), and a clamping lever (12).

Figure 2:
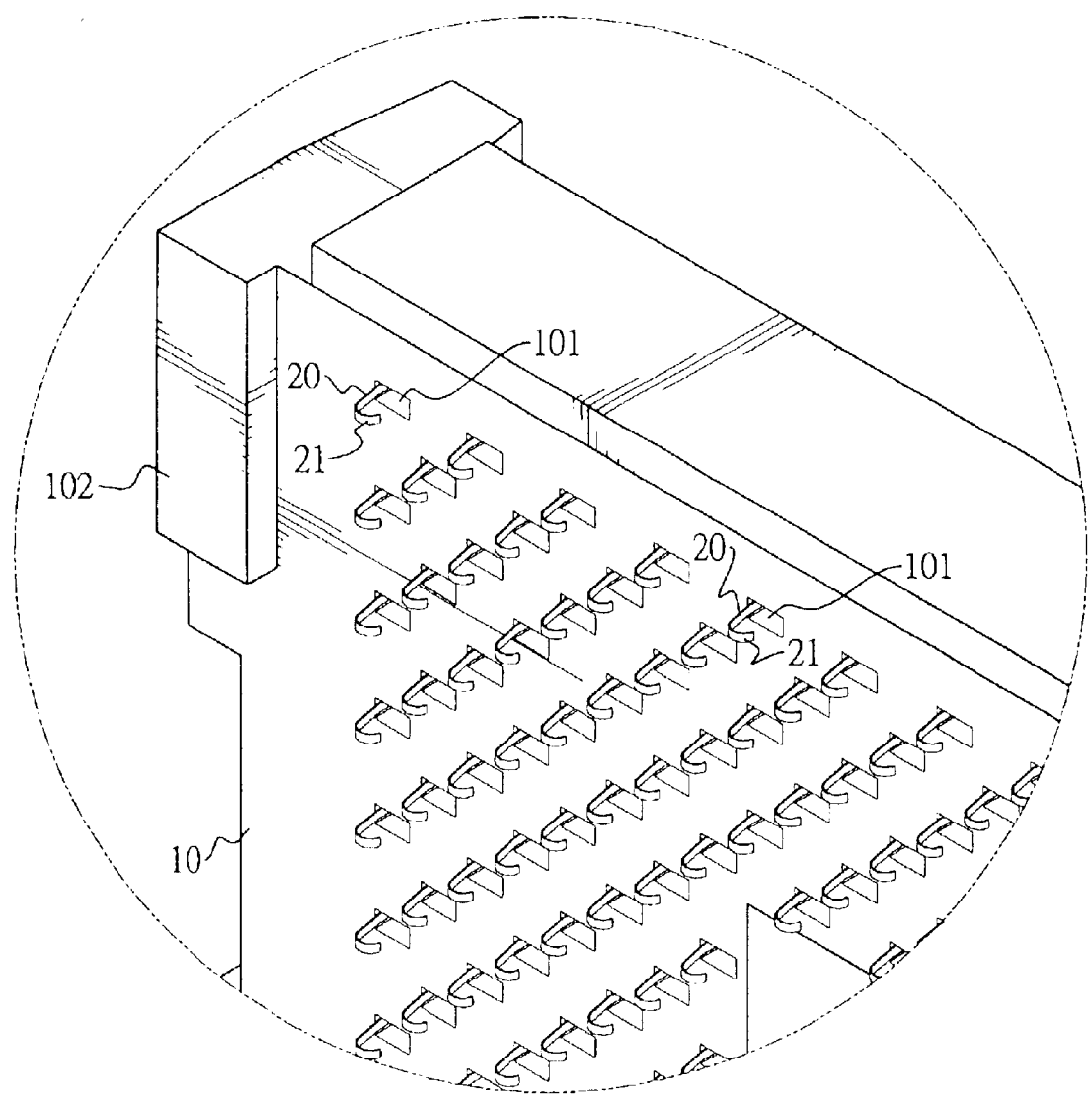
FIG. 2 is an exploded diagram of part of the connector in accordance with the invention.
Figure 3:
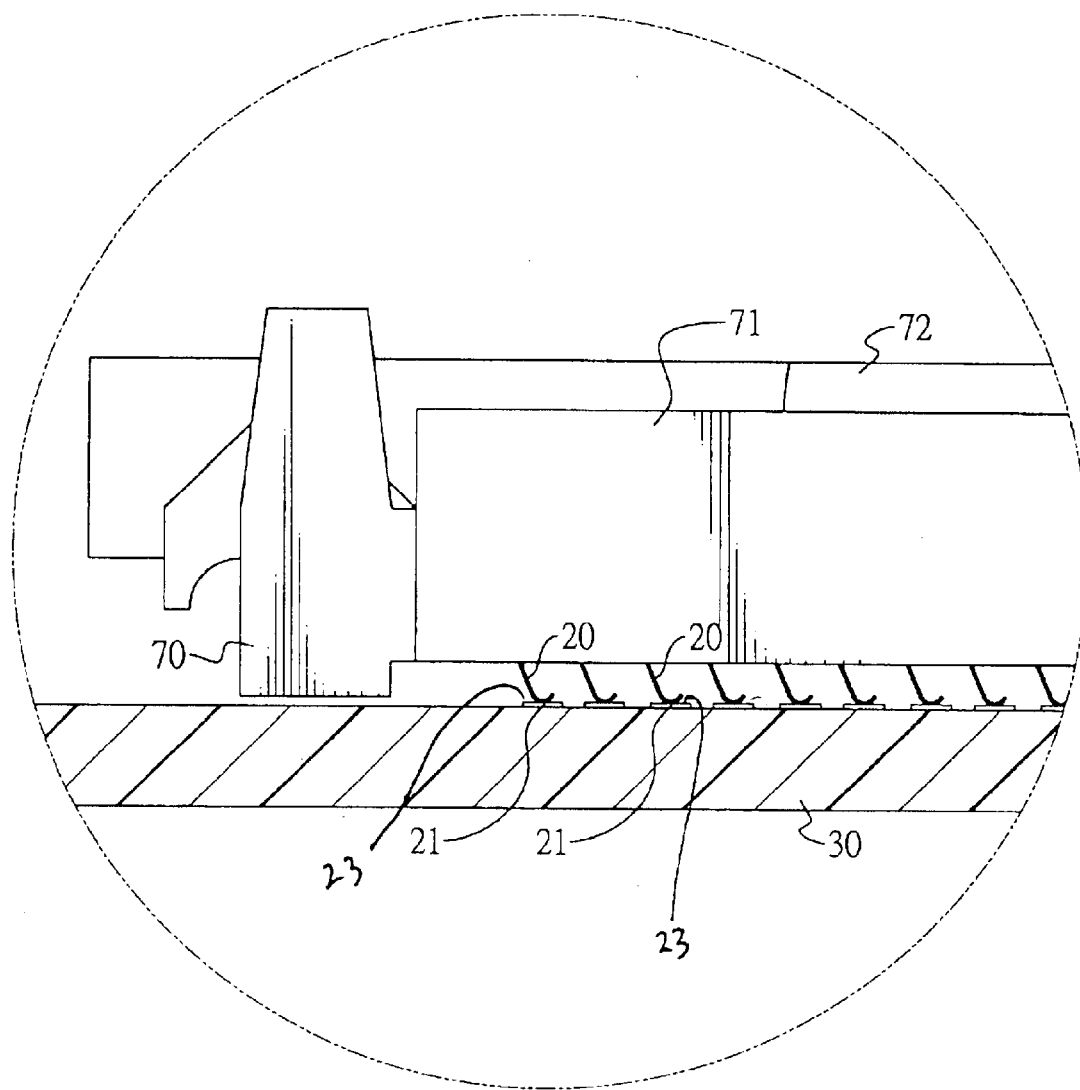
FIG. 3 is a lateral view of an assembled connector on the substrate in accordance with the invention.
Figure 4:
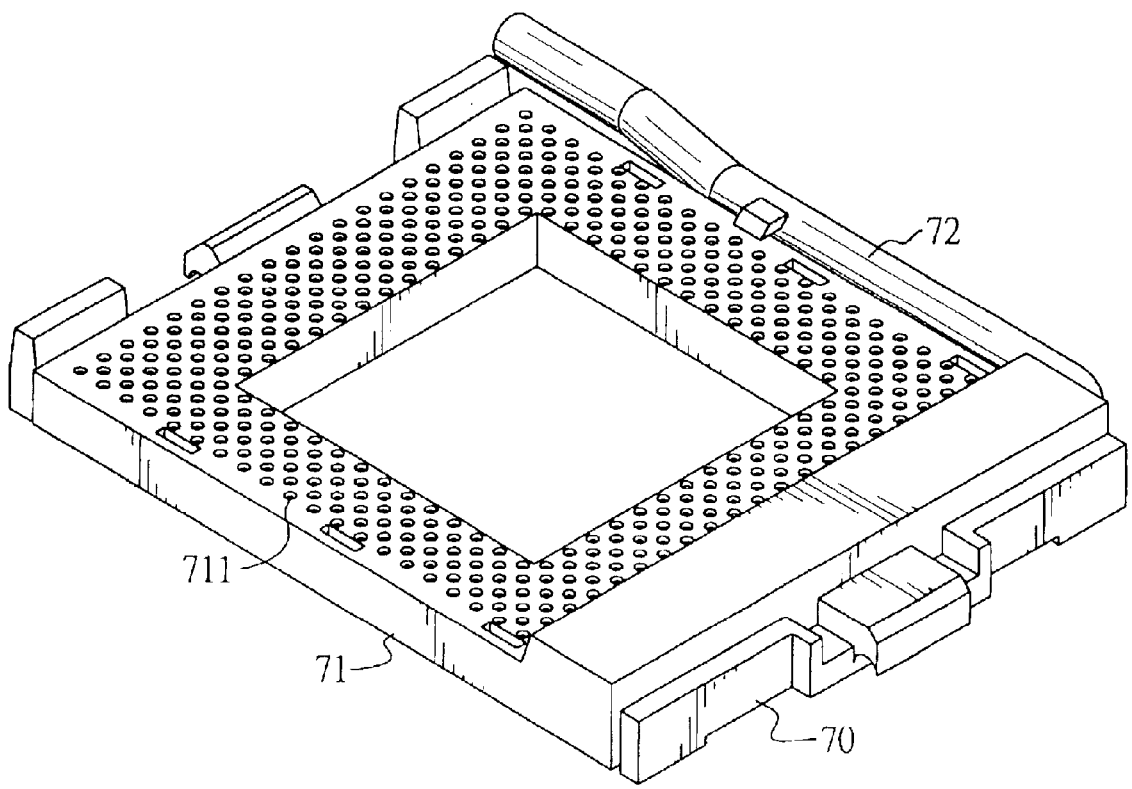
FIG. 4 is a diagram of a conventional zero insertion force connector.
Figure 6:
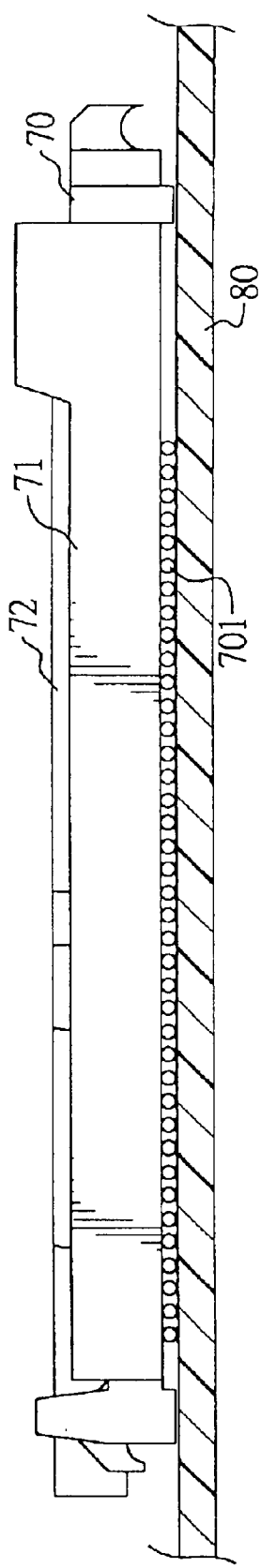
FIG. 6 is an assembly of a conventional zero insertion force connector with ball grid array constructs on a substrate.
Figure 5:
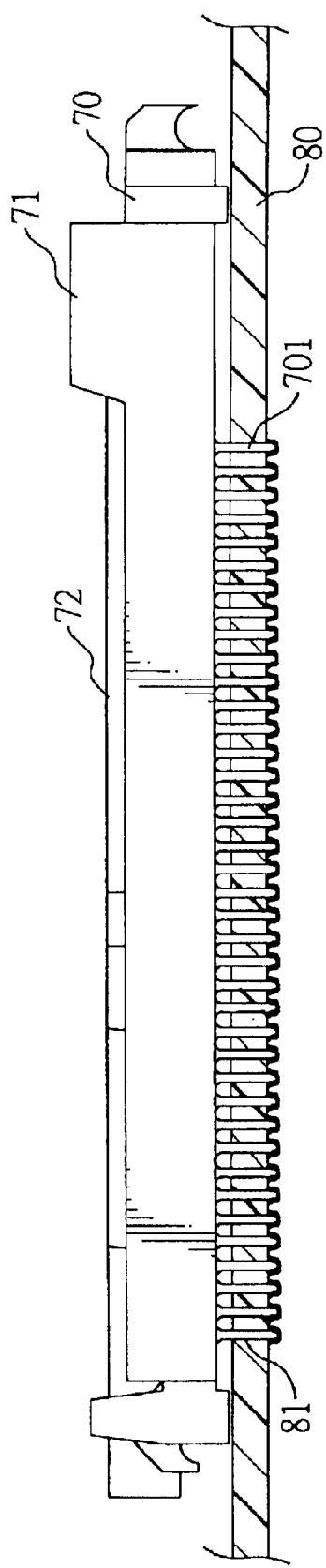
FIG. 5 is an assembly of a conventional zero insertion force connector with a pin grid array construct on a substrate.

The connector base (10) is formed with multiple terminal slots (101) in an array format, each of which is installed with a connecting terminal (20) as shown in FIG. 2.

The sliding cover (11) also has multiple insertion holes (not shown in the diagrams) on surface thereof. The cover (11) is used for covering the connector base (10). When the cover (11) is shifted horizontally into a predetermined position, each insertion hole is matched up with a connecting terminal (20) on the connector base (10).

The clamping lever (12) shaped like an "L" has a pivot mechanism, which enables the horizontal portion to be installed on one end common to both the connector base (10) and the sliding cover (11), clamping together the opposing faces of the connector base (10) and the sliding cover (11) but separated by a small distance to prevent shifting of the sliding cover (11) in the horizontal direction after installing the connector on the substrate.

The basic structure of the connector base (10), sliding cover (11) and clamping lever (12) and the operating principles largely resemble a conventional zero insertion force connector, so this part will not be further discussed in the specifications of the present invention.

The present invention is characterized in that the lower portion of the connecting terminal (20) is suitably bent at an inclined angle into a J-shape, forming an arcuate contact surface (21) that is matched against a corresponding solder pad (23) on the substrate at a predetermined position, which leads to the internal circuit of the substrate.

According to the design of the present invention, the connecting terminals (20) are capable of forming good electrical connection between the connector and the substrate. When the connector is appropriately placed over the substrate (30), the arcuate contact surface (21) of each connecting terminal (20) on the connector base (10) comes in contact with the corresponding solder pad (23) on the substrate (30). With a small amount of applied pressure, the contacting area between the connecting terminal (20) and the solder pad on the contact surface will increase in proportion to the applied force, thus allowing the connecting terminals (20) to make good contact even on substrates (30) that are not so smooth. After soldering the projections at the back of the substrate, the connector is joined with the substrate (30) with good reliability.

The connector base (10) has two check blocks (102) on the lateral sides to prevent over-depressing of the connector. The height of each check block (102) is less than the height of the connecting terminal (20), so that it can prevent over-depressing of the connecting terminal (20) when force is applied on the connector to install the connector on the substrate.

The present invention provides a connector that can prevent both physical damage to the plated through holes and poor contacts with the BGA packages, in which the lower portion of the connecting terminals (20) is suitably bent at an inclined angle to form an arcuate contact surface for engagement with a solder pad (23) on the substrate (30). When external force is applied on the connector during installation, the surface area on the contact surface (21) is enlarged in proportion to the applied force, enabling the connecting terminals on the connector to form good electrical connection with the corresponding solder pads (23) on the substrate. Thus the previously mentioned problem of poor contacts for ball grid array connectors and physical damage to the plated through holes on the substrate can be prevented under the current practice of the invention.

The foregoing description of the preferred embodiments of the present invention is intended to be illustrative only and, under no circumstances, should the scope of the present invention be so restricted.

What is claimed is:

1. A zero insertion force connector basing on surface contact, comprising a connector base having multiple connecting terminals in an array format installed thereon, wherein each connecting terminal is formed by a narrow strip, such that a lower portion of the connecting terminal is bent into an arcuate J-shape to form a contact surface for engagement with a solder pad on a substrate;

a sliding cover with multiple insertion holes defined therethrough is placed over the connector base after shifting horizontally into position, such that the multiple insertion holes are lined up with the connecting terminals on the connector base; and a clamping lever with an "L" shape construct, such that the horizontal portion is pivotally installed on one end common to both the connector base and the sliding cover, clamping together opposing faces of the connector base and the sliding cover to prevent shifting of the sliding cover in the horizontal direction after installing the connector on the substrate, a contact area between the contact surface and the solder pad enlargeable in proportion to a force applied to the connector terminal.

2. The zero insertion force connector as claimed in claim 1, wherein the connector base has a salient check block on each of the two lateral sides, for preventing over-depressing of the connecting terminals, each salient check block having a height which has to be less than the extended portion of the connecting terminal.

* * * * *